US012166015B2

(12) United States Patent
Hsieh et al.

(10) Patent No.: US 12,166,015 B2
(45) Date of Patent: Dec. 10, 2024

(54) SEMICONDUCTOR PACKAGE AND MANUFACTURING METHOD OF SEMICONDUCTOR PACKAGE

(71) Applicant: Taiwan Semiconductor Manufacturing Company, Ltd., Hsinchu (TW)

(72) Inventors: Wei-Kang Hsieh, Hsinchu (TW); Hung-Yi Kuo, Taipei (TW); Hao-Yi Tsai, Hsinchu (TW); Kuo-Lung Pan, Hsinchu (TW); Ting Hao Kuo, Hsinchu (TW); Yu-Chia Lai, Miaoli County (TW); Mao-Yen Chang, Kaohsiung (TW); Po-Yuan Teng, Hsinchu (TW); Shu-Rong Chun, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/185,358

(22) Filed: Mar. 16, 2023

(65) Prior Publication Data
US 2023/0223382 A1  Jul. 13, 2023

Related U.S. Application Data

(60) Continuation of application No. 17/315,381, filed on May 10, 2021, now Pat. No. 11,646,296, which is a
(Continued)

(51) Int. Cl.
*H01L 25/065*  (2023.01)
*H01L 23/00*  (2006.01)
(Continued)

(52) U.S. Cl.
CPC ...... *H01L 25/0657* (2013.01); *H01L 23/3128* (2013.01); *H01L 23/5383* (2013.01);
(Continued)

(58) Field of Classification Search
CPC ............ H01L 25/0657; H01L 23/5389; H01L 25/0652; H01L 24/02; H01L 24/13;
(Continued)

(56) References Cited

U.S. PATENT DOCUMENTS 9,000,584 B2  4/2015  Lin et al.
9,048,222 B2  6/2015  Hung et al.
(Continued)

*Primary Examiner* — Shahed Ahmed
*Assistant Examiner* — Khatib A Rahman
(74) *Attorney, Agent, or Firm* — JCIPRNET

(57) ABSTRACT

A semiconductor package includes a lower semiconductor device, a plurality of conductive pillars, an upper semiconductor device, an encapsulating material, and a redistribution structure. The plurality of conductive pillars are disposed on the lower semiconductor device along a direction parallel to a side of the lower semiconductor device. The upper semiconductor device is disposed on the lower semiconductor device and reveals a portion of the lower semiconductor device where the plurality of conductive pillars are disposed, wherein the plurality of conductive pillars disposed by the same side of the upper semiconductor device and the upper semiconductor device comprises a cantilever part cantilevered over the at least one lower semiconductor device. The encapsulating material encapsulates the lower semiconductor device, the plurality of conductive pillars, and the upper semiconductor device. The redistribution structure is disposed over the upper semiconductor device and the encapsulating material.

20 Claims, 9 Drawing Sheets

Related U.S. Application Data division of application No. 16/133,702, filed on Sep. 18, 2018, now Pat. No. 11,004,827.

(51) Int. Cl.
  H01L 23/31 (2006.01)
  H01L 23/538 (2006.01)
  H01L 25/00 (2006.01)

(52) U.S. Cl.
  CPC .............. *H01L 24/02* (2013.01); *H01L 24/13* (2013.01); *H01L 24/14* (2013.01); *H01L 24/16* (2013.01); *H01L 24/24* (2013.01); *H01L 24/25* (2013.01); *H01L 24/32* (2013.01); *H01L 24/73* (2013.01); *H01L 25/50* (2013.01); *H01L 2224/02373* (2013.01); *H01L 2224/02375* (2013.01); *H01L 2224/02377* (2013.01); *H01L 2224/13024* (2013.01); *H01L 2224/14131* (2013.01); *H01L 2224/14132* (2013.01); *H01L 2224/14134* (2013.01); *H01L 2224/16225* (2013.01); *H01L 2224/24147* (2013.01); *H01L 2224/25171* (2013.01); *H01L 2224/32145* (2013.01); *H01L 2224/32225* (2013.01); *H01L 2224/73203* (2013.01); *H01L 2224/73253* (2013.01); *H01L 2224/73267* (2013.01); *H01L 2225/06527* (2013.01); *H01L 2225/06562* (2013.01)

(58) Field of Classification Search
  CPC ......... H01L 24/14; H01L 24/25; H01L 24/32; H01L 24/73; H01L 25/50; H01L 2224/02373; H01L 2224/02375; H01L 2224/02377; H01L 2224/13024; H01L 2224/14131; H01L 2224/14132; H01L 2224/14134; H01L 2224/24147; H01L 2224/25171; H01L 2224/32145; H01L 2224/32225; H01L 2224/73267; H01L 2225/06527; H01L 2225/06562; H01L 2224/24145; H01L 24/19; H01L 24/20; H01L 24/82; H01L 23/3128; H01L 2221/68345; H01L 2224/18; H01L 21/6835; H01L 2225/06524; H01L 2225/06575; H01L 2924/181; H01L 24/24; H01L 23/5383; H01L 24/16; H01L 2224/16225; H01L 2224/73203; H01L 2224/73253

See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,685,350 B2 * | 6/2017 | Lin | H01L 21/485 |
| 2014/0203456 A1 * | 7/2014 | Hsu | H01L 25/50 |
| | | | 257/777 |
| 2014/0252646 A1 * | 9/2014 | Hung | H01L 25/0657 |
| | | | 257/774 |
| 2017/0207197 A1 * | 7/2017 | Yu | H01L 24/92 |

* cited by examiner

SEMICONDUCTOR PACKAGE AND MANUFACTURING METHOD OF SEMICONDUCTOR PACKAGE

CROSS-REFERENCE TO RELATED APPLICATION

This application is a continuation application of and claims the priority benefit of a prior application Ser. No. 17/315,381, filed on May 10, 2021. The prior application Ser. No. 17/315,381 is a divisional application of and claims the priority benefit of a prior application Ser. No. 16/133,702, filed on Sep. 18, 2018, U.S. Pat. No. 11,004,827B2, issued on May 11, 2021. The entirety of each of the above-mentioned patent applications is hereby incorporated by reference herein and made a part of this specification.

BACKGROUND

Stacked dies are commonly used in Three-Dimensional (3D) integrated circuits. Through the stacking of dies, the footprint (form factor) of semiconductor packages is reduced. In addition, the metal line routing in the dies is significantly simplified through the formation of stacked dies.

In some conventional applications, a plurality of dies is stacked to form a die stack. The total count of the stacked dies may sometimes reach eight or more. The stacked dies are encapsulated in encapsulating material, and a redistribution structure may then be disposed over the stacked dies for electrical connection. However, with different configuration of the stacked dies, the layout of the redistribution structure need to be modified accordingly, which complicates the manufacturing process of the semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
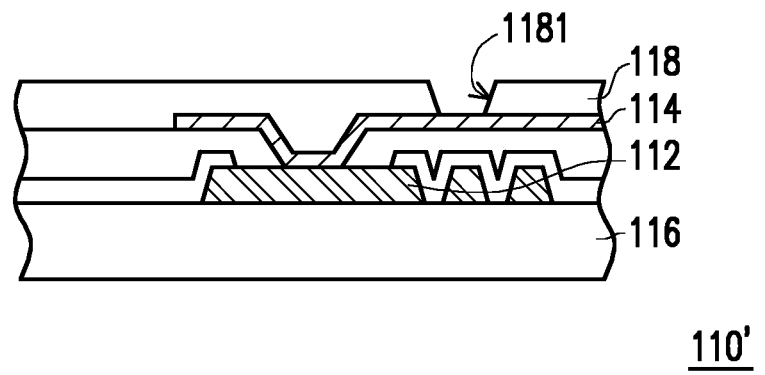
FIG. 1 to FIG. 7 illustrate schematic cross sectional views of various stages in a manufacturing process of a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 7 illustrate schematic cross sectional views of various stages in a manufacturing process of a semiconductor package in accordance with some embodiments. In exemplary embodiments, the manufacturing process of the semiconductor package disclosed herein may be part of a wafer level packaging process. In some embodiments, one semiconductor device is shown to represent plural semiconductor devices of the wafer, and one single package is shown to represent plural semiconductor packages obtained the following semiconductor manufacturing process. The manufacturing process of the semiconductor package in the disclosure may include the following steps.

Figure 3:
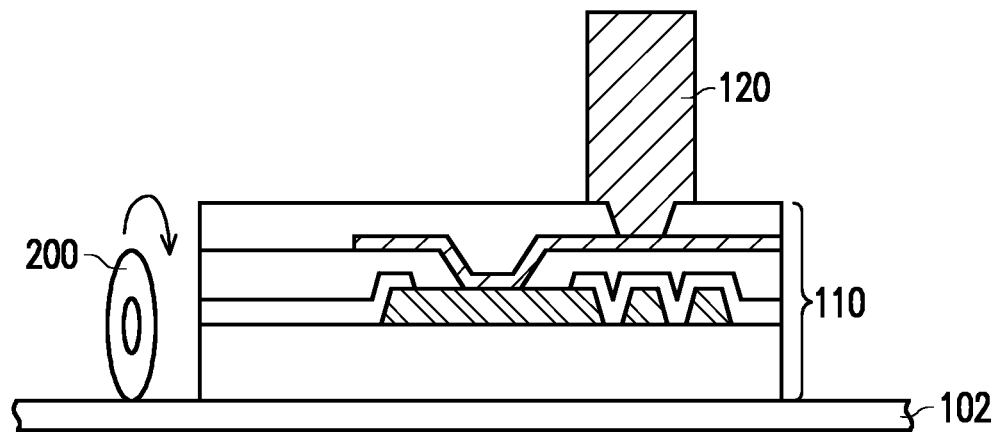
Figure 4:
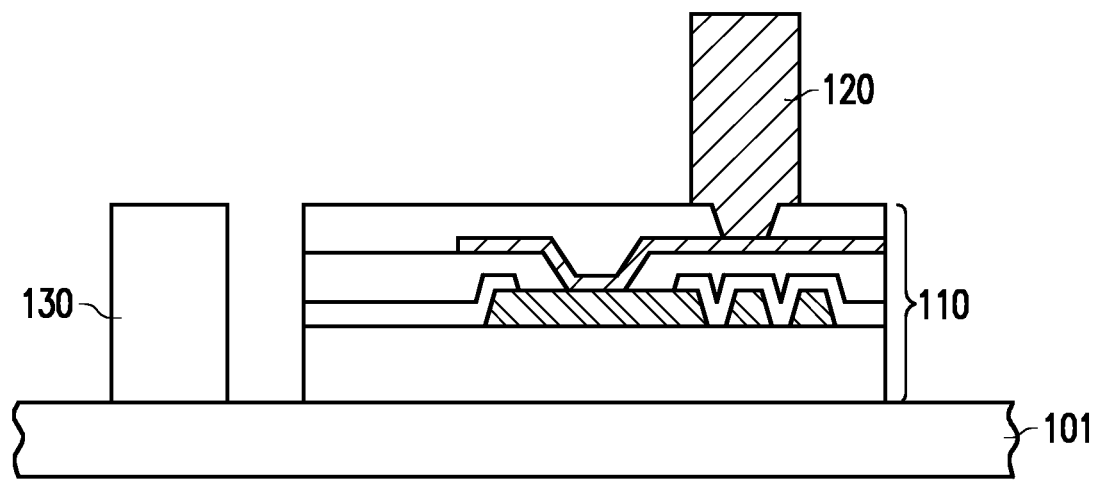

In some embodiments, at least one lower semiconductor device 110 is provided on a carrier 101 as it is shown in FIG. 4. In accordance with some embodiments of the present disclosure, the lower semiconductor device 110 may be a memory die, which may be a Dynamic Random Access Memory (DRAM) die, a Negative-AND (NAND) die, a Static Random Access Memory (SRAM) die, a Double-Data-Rate (DDR) die, or the like. The lower semiconductor device 110 may also be a logic device die or an integrated passive device die (with no active devices therein). The lower semiconductor device 110 may be a single memory die or a memory die stack. The respective steps of forming the lower semiconductor device 110 and the conductive pillars 120 thereon are illustrated in the process flow shown in FIG. 1 to FIG. 3.

In some embodiments, the carrier 101 may be a glass carrier or any suitable carrier for the manufacturing process of the semiconductor package. In some embodiments, the carrier 101 may be coated with a de-bonding layer (e.g. the de-bonding layer 104 shown in FIG. 10). The material of the de-bonding layer may be any material suitable for de-bonding the carrier 101 from the above layers disposed thereon. For example, the de-bonding layer may be a ultraviolet (UV) curable adhesive, a heat curable adhesive, an optical clear adhesive or a light-to-heat conversion (LTHC) adhesive, or the like, although other types of de-bonding layer may be used. In addition, the de-bonding layer may be also adapted to allow light or signal to pass through. It is noted that the materials of the de-bonding layer and the carrier 101 are merely for illustration, and the disclosure is not limited thereto.

Figure 2:
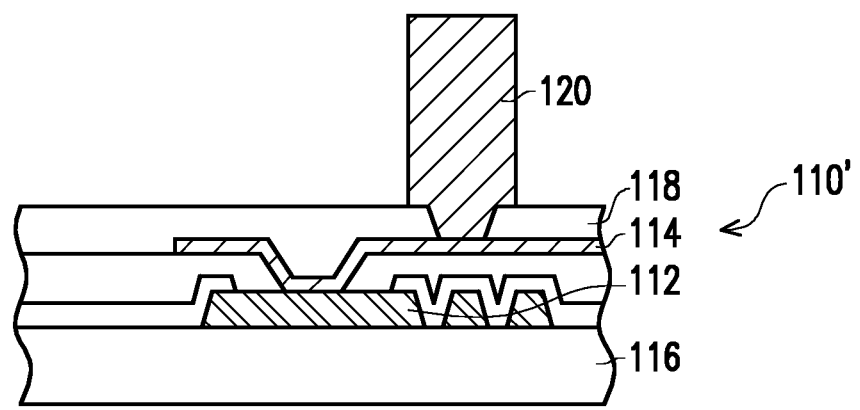

With reference now to FIG. 1, in some embodiments, a lower semiconductor device 110' in a wafer form is firstly provided. The wafer-form lower semiconductor device 110' includes a plurality of lower semiconductor device units, which can be diced into a plurality of lower semiconductor device 110 in the sequential process. For the sake of clarity and simplicity, one of the lower semiconductor device units is illustrated in FIG. 1 and FIG. 2. Accordingly, throughout the description, the lower semiconductor device 110' can denote one of the lower semiconductor device units. In some embodiments, the lower semiconductor device 110' includes a substrate 116, a plurality of electrical terminals 112 disposed on the substrate 116, and a plurality of redistribution lines 114 electrically connected to the plurality of electrical terminals 112. In some embodiments, the substrate 116 may be formed of semiconductor material with good thermal conductivity, such as silicon, etc. In some embodiments, active devices (not shown) such as transistors and/or diodes are formed at the top surfaces of the substrate 116.

In some embodiments, the electrical terminals 112 may be metal pillars or metal pads, etc. The electrical terminals 112 are electrically coupled to the integrated circuits (not shown) inside the lower semiconductor device 110'. In some embodiments, the electrical terminals 112 may be copper pillars, and may also include other conductive/metallic materials such as aluminum, nickel, or the like. In the present embodiment, the electrical terminals 112 may be offset from the center of the lower semiconductor device 110'. In accordance with some exemplary embodiments of the present disclosure, the lower semiconductor device 110' may further include a passivation layer 118 disposed on the redistribution lines 114 and having a plurality of openings 1181 for revealing a part of the redistribution lines 114. In some embodiments, the passivation layer 118 may be formed of a polymer such as polybenzoxazole (PBO) or polyimide in accordance with some exemplary embodiments.

Figure 8:
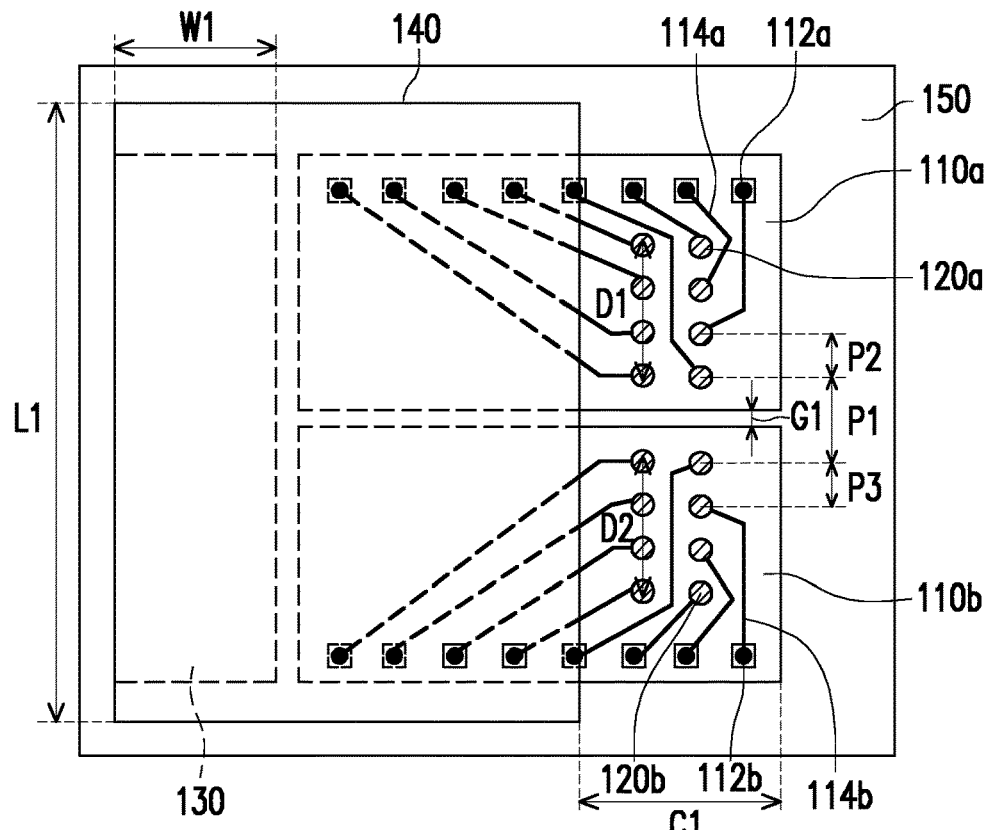
FIG. 8 illustrates a schematic top view of an intermediate stage in a manufacturing process of a semiconductor package in accordance with some embodiments.
Figure 9:
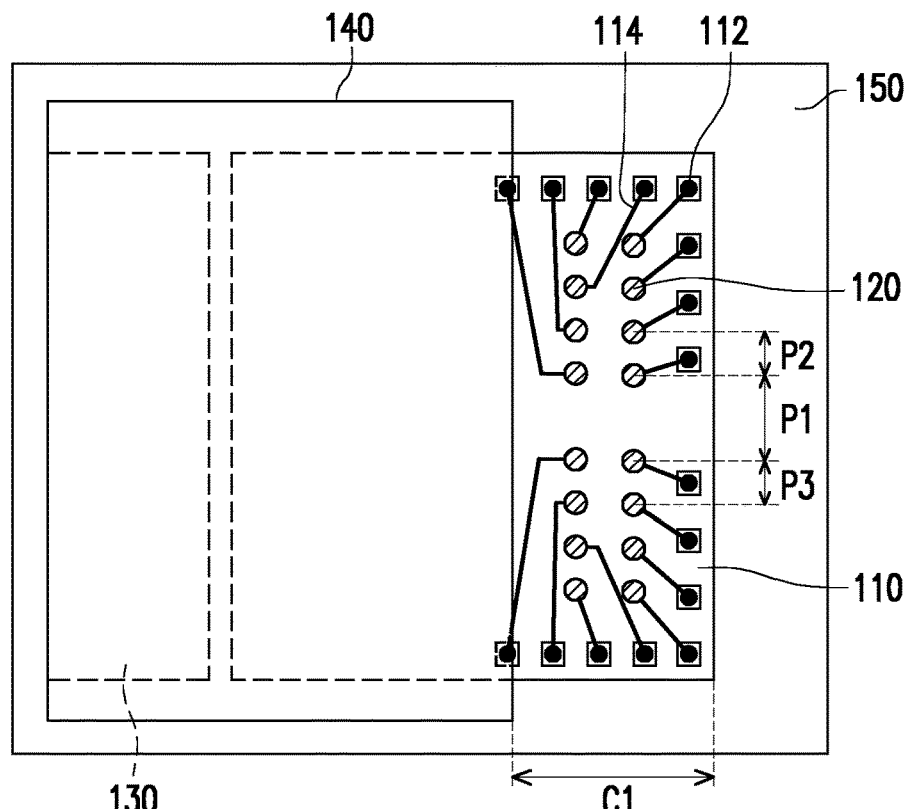
FIG. 9 illustrates a schematic top view of an intermediate stage in a manufacturing process of a semiconductor package in accordance with some embodiments.

With reference now to FIG. 2, a plurality of conductive pillars 120 are formed on the lower semiconductor device 110'. In accordance with some embodiments of the present disclosure, the conductive pillars 120 are disposed along a direction parallel to a side (e.g. the right side) of the lower semiconductor device 110' as it is shown in FIG. 8 and FIG. 9, and are electrically connected to the electrical terminals 112 respectively. In some embodiments, the conductive pillars 120 are offset from the center of the lower semiconductor device 110'. In the present embodiment, multiple columns of the conductive pillars 120 arranged along the direction parallel to the (right) side of the lower semiconductor device 110' are illustrated herein, but the disclosure is not limited thereto. The number of the conductive pillars 120 (or the number of the columns of the conductive pillars 120) is in accordance with the number of the electrical terminals 112. In some embodiments, the conductive pillars 120 are formed in the openings 1181 of the passivation layer 118 to contact, and electrically connected to, the redistribution lines 114 exposed by the openings 1181 of the passivation layer 118. Accordingly, the electrical terminals 112 are electrically connected to the plurality of conductive pillars 120 through the redistribution lines 114 respectively.

The formation of conductive pillars 120 may include the following steps. Firstly, a seed layer is formed. The seed layer may include a titanium layer and a copper layer over the titanium layer, and the seed layer may extend into the openings 1181 of the passivation layer 118 to contact, and electrically coupling to, the redistribution lines 114. Then, a mask layer is formed over the seed layer, and is then patterned to form openings, through which some portions of the seed layer are exposed. Then, the conductive pillars 120 are formed in openings of the mask layer through plating. The mask layer is then removed. In accordance with some embodiments of the present disclosure, after the removal of the mask layer, the portions of the seed layer not directly underlying the conductive pillars 120 are removed in an etching process. The remaining portions of the seed layer thus become the bottom portions of the conductive pillars 120. Throughout the description, the conductive pillars 120 refer to the portions of the plated material and the seed layer protruding higher than the top surface of the passivation layer 118. The portions of the plated conductive material and the seed layer extending into the openings 1181 of the passivation layer 118 may be referred to as vias, which connect the overlying conductive pillars 120 to the underlying redistribution lines 114.

Then, in some embodiments, the lower semiconductor device 110' may be flipped over and a thinning process may be optionally performed on a back surface of the substrate 116 of the lower semiconductor device 110'. The thinning process may be, for example, a mechanical grinding or CMP process whereby chemical etchants and abrasives are utilized to react and grind away the substrate 116 of the lower semiconductor device 110'. However, while the CMP process described above is presented as one illustrative embodiment, it is not intended to be limiting to the embodiments. Any other suitable removal process may alternatively be used to thin the lower semiconductor device 110'. For example, a series of chemical etches may alternatively be utilized. This process and any other suitable process may alternatively be utilized, and all such processes are fully intended to be included within the scope of the embodiments.

With reference now to FIG. 3, the lower semiconductor device 110' may be disposed on a tape carrier 102 by attaching the (ground) back surface of the lower semiconductor device 110' to the tape carrier 102. In some embodiments, the lower semiconductor device 110' may be attached to the tape carrier 102 through the adhesive on the tape carrier 102 itself or through, for example, a die attach film (DAF). The tape carrier 102 bearing the lower semiconductor device 110' may further include a frame structure, which may be a metal ring intended to provide support and stability for the structure during the sequential process. In some embodiments, the tape carrier 102 may be made of, for example, polymer material with flexibility. In some embodiments, a singularizing process is performed to the lower semiconductor device 110' on the tape carrier 102 to form a plurality of lower semiconductor devices 110 independent from one another. One of the lower semiconductor devices 110 is illustrated in FIG. 3 for the sake of clarity and simplicity. In an embodiment, the singularizing process may be performed by using a saw blade 200 to slice through the lower semiconductor device 110'. Thereby, one unit of the lower semiconductor device 110' is separated from another to form a plurality of the lower semiconductor device 110.

However, as one of ordinary skill in the art will recognize, utilizing a saw blade to singularize the lower semiconductor device 110' is merely one illustrative embodiment and is not intended to be limiting. Alternative methods for singularizing the lower semiconductor device 110', such as utilizing one or more etches to separate lower semiconductor device 110' and form the lower semiconductor devices 110, may alternatively be utilized. These methods and any other suitable methods may alternatively be utilized for singularizing process.

FIG. 8 illustrates a schematic top view of an intermediate stage in a manufacturing process of a semiconductor package in accordance with some embodiments. With reference now to FIG. 4 and FIG. 8, at least one of the lower semiconductor devices 110 is then provided on the carrier 101. In the embodiment shown in FIG. 8, a plurality of the lower semiconductor devices 110 (two are illustrated but not limited thereto) are provided. For example, the lower semiconductor devices 110 may include a first lower semiconductor device 110a and a second lower semiconductor device 110b, which are arranged in a side by side manner as it is shown in FIG. 8. In the present embodiment, a plurality of first electrical terminals 112a of the first lower semiconductor device 110a may be offset from the center of the first lower semiconductor device 110a, and a plurality of second electrical terminals 112b of the second lower semiconductor device 110b may be offset from the center of the second lower semiconductor device 110b. In some embodiments, the first electrical terminals 112a are disposed along a long side (e.g. an upper side) of the first lower semiconductor device 110a, and the second electrical terminals 112b are disposed along a long side (e.g. a lower side) of the second lower semiconductor device 110b.

For example, the first electrical terminals 112a are disposed along the upper side of the first lower semiconductor device 110a, while no first electrical terminal 112a is formed either close to the center or on the lower side of the first lower semiconductor device 110a. The second electrical terminals 112b, on the other hand, are disposed on the second lower semiconductor device 110b along the lower side of the second lower semiconductor device 110b, while no second electrical terminal 112b is formed either close to the center or on the upper side of second lower semiconductor device 110b. However, the embodiment is merely for illustration and is not intended to limit the arrangement of the electrical terminals 112a, 112b.

In some embodiments, the first conductive pillars 120a, which are disposed on the first lower semiconductor device 110a and electrically connected to the first electrical terminals 112a, are arranged along a first direction D1 parallel to a (short) side (e.g. a right side) of the first lower semiconductor device 110a. Accordingly, the first direction D1 is perpendicular to the long side where the first electrical terminals 112a are disposed. Similarly, the second conductive pillars 120b, which are disposed on the second lower semiconductor device 110b and electrically connected to the second electrical terminals 112b, are arranged along a second direction D2 parallel to a (short) side (e.g. a right side) of the second lower semiconductor device 110b. Accordingly, the second direction D2 is perpendicular to the long side where the second electrical terminals 112b are disposed. In some embodiments, the first direction D1 is substantially collinear with the second direction D2. Namely, the arrangement of the first conductive pillars 120a and the second conductive pillars 120b are substantially collinear with one another.

In accordance with some embodiments of the disclosure, the first lower semiconductor device 110a and the second lower semiconductor device 110b are arranged in a side by side manner with a gap P1 exist therebetween. For example, the gap P1 may range between about 50 μm to about 100 μm. Therefore, a shortest distance P1 between the first conductive pillar 120a that is closest to the second lower semiconductor device 110a and the second conductive pillar 120b that is closest to the first lower semiconductor device 110a is substantially longer than a gap P2 between any adjacent two of the first conductive pillars 120a. Moreover, the shortest distance P1 between the first conductive pillar 120a that is closest to the second lower semiconductor device 110a and the second conductive pillar 120b that is closest to the first lower semiconductor device 110a is substantially longer than a gap P3 between any adjacent two of the second conductive pillars 120b. In some embodiments, the gaps P2 between the first conductive pillars 120a and the gaps P3 between the second conductive pillars 120b may not necessarily be the same, but the shortest distance P1 should be substantially longer than the greatest gap P2 and/or gap P3. In some embodiments, the shortest distance P1 is substantially greater than 50 μm.

FIG. 9 illustrates a schematic top view of an intermediate stage in a manufacturing process of a semiconductor package in accordance with some embodiments. It is noted that the semiconductor package shown in FIG. 9 contains many features same as or similar to the semiconductor package disclosed earlier with FIG. 1 to FIG. 4 and FIG. 8. For purpose of clarity and simplicity, detail description of same or similar features may be omitted, and the same or similar reference numbers denote the same or like components. It should be understood that some components of the semiconductor package are omitted or illustrated in a perspective manner in FIG. 8 and FIG. 9 to better illustrate the underlying structure. The main differences between the semiconductor package shown in FIG. 9 and the semiconductor package shown in FIG. 8 are described as follows.

With reference now to FIG. 4 and FIG. 9, in the present embodiment, one of the lower semiconductor devices 110 is provided on the carrier 101. In accordance with some embodiments of the disclosure, at least some of the electrical terminals 112 are disposed along a side (e.g. the right side) of the lower semiconductor device 110, while no electrical terminal 112 is formed either close to the center or on the left side of the lower semiconductor device 110. Some of the electrical terminals 112 may be disposed along two opposite sides (e.g. the upper side and the lower side) of the lower semiconductor device 110 that is connected to the (right) side of the lower semiconductor device 110. However, the embodiment is merely for illustration and is not intended to limit the arrangement of the electrical terminals 112. In one of the implementation of FIG. 9, a length of the lower semiconductor device 110 may be about 7 mm, and a width of the lower semiconductor device 110 may be equal to or less than about 7 mm, for example. On the other hand, in one of the implementation of FIG. 8, a length of the first lower semiconductor device 110a or the second lower semiconductor device 110b may be about 7 mm, while a width of the first lower semiconductor device 110a or the second lower semiconductor device 110b may be equal to or less than about 3.5 mm, for example.

In some embodiments, the conductive pillars 120 are disposed along a direction parallel to a side (e.g. the right side) of the lower semiconductor device 110. In some embodiments, the conductive pillars 120 are offset from a center of the lower semiconductor device 110. In accordance with some embodiments of the disclosure, the layout of the conductive pillars 120 shown in FIG. 9 is the substantially same as the configuration of the layout of the conductive pillars 120a, 120b shown in FIG. 8 even through the arrangements of the lower semiconductor devices are different in FIG. 8 and FIG. 9. Accordingly, the gap P1, corresponding to the shortest distance P1 in FIG. 8, between adjacent two of the conductive pillars 120 is substantially greater than the gap P2/P3, corresponding to the gap P2/P3 in FIG. 8, between any other adjacent two of the conductive pillars 120. In one of the implementation, the gap P1 between adjacent two of the conductive pillars 120 located in the middle of the lower semiconductor device 110 is substantially greater than the gap P2/P3 between any other adjacent two of the conductive pillars 120 that are not located in the middle of the lower semiconductor device 110. It is noted that the longest gap P1 may not necessarily located in the middle of the lower semiconductor device 110. The location of the gap P1 shown in FIG. 9 is corresponding to the location of the shortest distance P1 in FIG. 8. In some embodiments, the gap P1 in FIG. 9 is substantially the same as the shortest distance P1 in FIG. 8, and the gap P2/P3 in FIG. 9 are substantially the same as the gap P2/P3 in FIG. 8.

With such configuration, the semiconductor packages with different arrangement of the lower semiconductor device and different layout of electrical terminals can adopt the same process for forming the redistribution structure electrically connected to conductive pillars since the locations of conductive pillars are the same. Therefore, the manufacturing process of the semiconductor package can be simplified and can be applied to different designs and configurations of the lower semiconductor devices. Accordingly, the production cost of the semiconductor package can be reduced and the productivity of the semiconductor package can be increased.

With reference now to FIG. 4, FIG. 8 and FIG. 9, a dummy die 130 is disposed on a side of the lower semiconductor device 110/110a/110b. In some embodiments, an upper surface of the dummy die 130 is substantially coplanar with an upper surface of the lower semiconductor device 110. It is noted that the process shown in FIG. 4 to FIG. 7 can be applied to both the arrangements shown in FIG. 8 and FIG. 9. Therefore, the "lower semiconductor device 110" hereinafter may be referred to the first lower semiconductor device 110a and the second lower semiconductor device 110b shown in FIG. 8 and may also be referred to the lower semiconductor device 110 shown in FIG. 9. Similarly, the "conductive pillars 120" hereinafter may be referred to the first conductive pillars 120a and the second conductive pillars 120b shown in FIG. 8 and may also be referred to the conductive pillars 120 shown in FIG. 9.

In accordance with some embodiments of the disclosure, the dummy die 130 may be a blank die dicing from a dummy wafer with no active devices (such as transistors and diodes) and passive devices (such as resistors, capacitors, and inductors) formed therein. The dummy die 130 may be formed of a rigid material. In some embodiments, the dummy die 130 may be formed of a metal or a metal alloy, a semiconductor material, or a dielectric material. For example, when including metal, the dummy die 130 may be formed of copper, aluminum, nickel, or the like. When formed of a semiconductor material, the dummy die 130 may be a silicon die, which may be the same type of die on which active devices are formed. When formed of a dielectric material, the dummy die 130 may be formed of ceramic. In addition, the material of the dummy die 130 may be homogenous. In accordance with some exemplary embodiments, the dummy die 130 is formed of silicon, with a p-type or an n-type impurity doped in the dummy die 130. In accordance with alternative embodiments, no p-type impurity and n-type impurity are doped in the dummy die 130.

Figure 5:
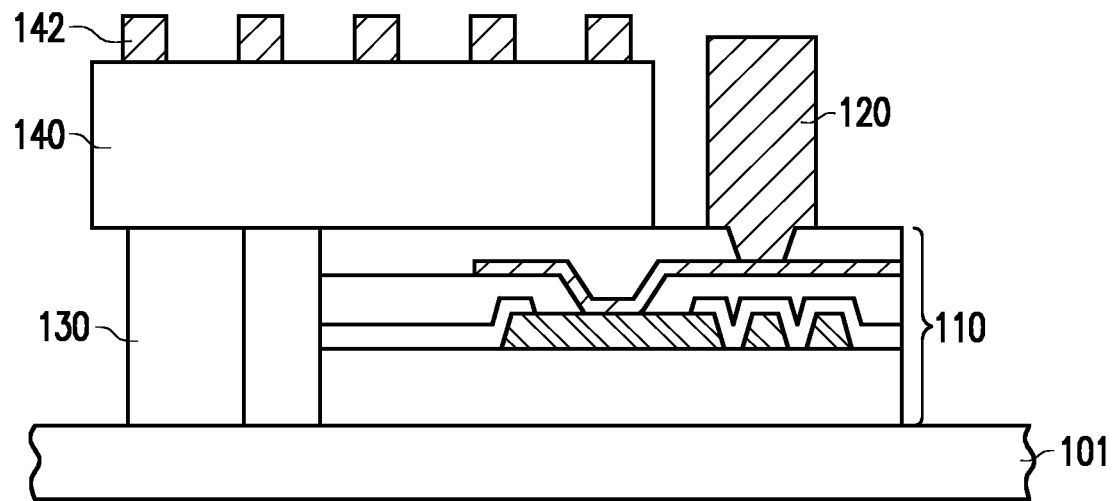

With reference now to FIG. 5, FIG. 8 and FIG. 9, an upper semiconductor device 140 is disposed on the lower semiconductor device 110 and the dummy die 130, and reveals a portion (e.g. the right portion) of the lower semiconductor device 110 where the conductive pillars 120 are disposed. In some embodiments, the conductive pillars 120 are disposed on a side of the lower semiconductor device 110 offset from the center. Therefore, for not interfering with the conductive pillars 120, the upper semiconductor device 140 is disposed offset from the center of the lower semiconductor device 110 to reveal the (right) portion of the lower semiconductor device 110 where the conductive pillars 120 are disposed. In some embodiments, the upper semiconductor device 140 is disposed offset from an (right) edge of the lower semiconductor device 110 for a clearance C1 about 350 μm to leave room for the conductive pillars 120. Accordingly, a part of the upper semiconductor device 140 may be cantilevered over the lower semiconductor device 110, and the dummy die 130 may be disposed underneath the cantilevered part of the upper semiconductor device 140 to provide support and prevent the upper semiconductor device 140 from cracking. It is noted that, in some embodiments, the dummy die 130 may be omitted according to the size of the upper semiconductor device 140. In some embodiments, a width W1 of the dummy die 130 may be about 1.2 mm, and a length L1 of the dummy die 130 may be about 7 mm, for example. The size of the dummy die 130 can be adjusted according to the sizes of the upper semiconductor device 140 and the lower semiconductor device 110.

Figure 6:
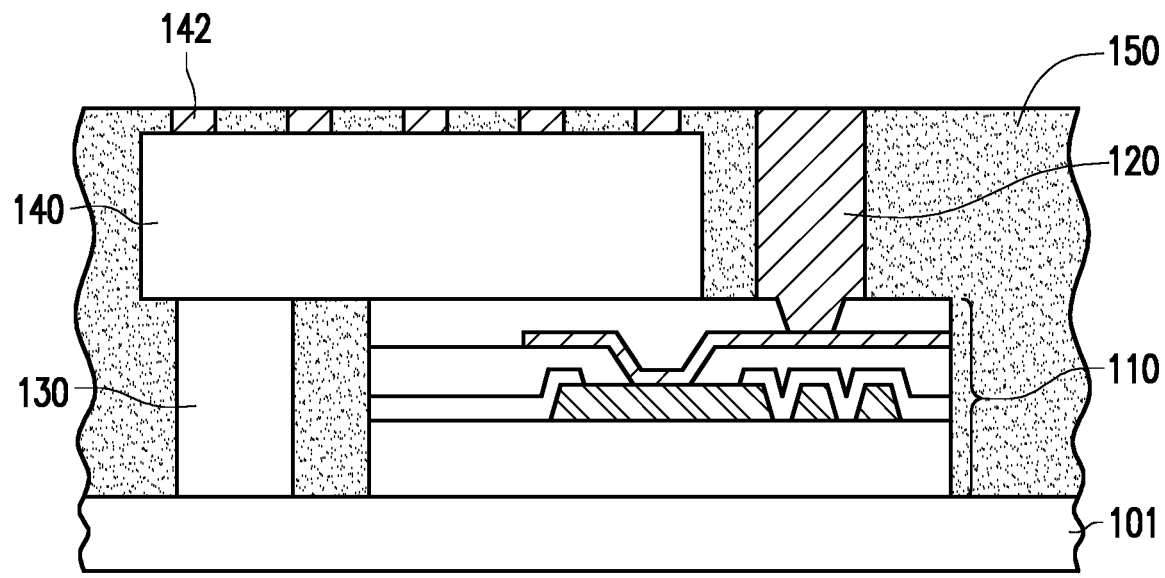

With reference now to FIG. 6, an encapsulating material 150 is formed on the carrier 101 and encapsulates encapsulating the lower semiconductor device 110, the plurality of conductive pillars 120, the dummy die 130 and the upper semiconductor device 140. In some embodiments, the encapsulating material 150 is a single-layered encapsulating material, which may include a molding compound formed by a molding process. The material of the encapsulating material 150 may include epoxy or other suitable resins. For example, the encapsulating material 150 may be epoxy resin containing chemical filler. In some embodiments, the encapsulating material 150 is formed over the upper semiconductor device 140 and covers the top surfaces of the conductive pillars 120 and the top surface of the upper semiconductor device 140, so as to form an encapsulated semiconductor device on the carrier 101 as it is shown in FIG. 6.

In some embodiments, a thinning process is performed on a top surface of the encapsulated semiconductor device. Accordingly, the encapsulating material 150 is ground to reveal the conductive pillars 120 and a plurality of the electrical terminals 142 of the upper semiconductor device 140. In some embodiments, the thinning process may be, for example, a mechanical grinding or CMP process whereby chemical etchants and abrasives are utilized to react and grind away the encapsulating material 150. The resulting structure is shown in FIG. 6. After the thinning process is performed, the top surfaces of electrical terminals 142 of the upper semiconductor device 140 and the conductive pillars 120 are substantially level with the top surface of the encapsulating material 150 as shown in FIG. 6. However, while the CMP process described above is presented as one illustrative embodiment, it is not intended to be limiting to the embodiments. Any other suitable removal process may alternatively be used to thin the encapsulating material 150. For example, a series of chemical etches may alternatively be utilized. This process and any other suitable process may alternatively be utilized, and all such processes are fully intended to be included within the scope of the embodiments.

In some embodiment, the top surface of the encapsulating material 150 are ground and polished until the conductive pillars 120 and the electrical terminals 142 of the upper semiconductor device 140 are revealed. In some embodiments, the tips of the conductive pillars 120 and/or the tips of the electrical terminals 142 may also be ground to obtain a substantially planar surface. Accordingly, a ground surface of the encapsulating material 150 is substantially coplanar with the top surfaces of the conductive pillars 120 and the electrical terminals 142 of the upper semiconductor device 140.

Figure 7:
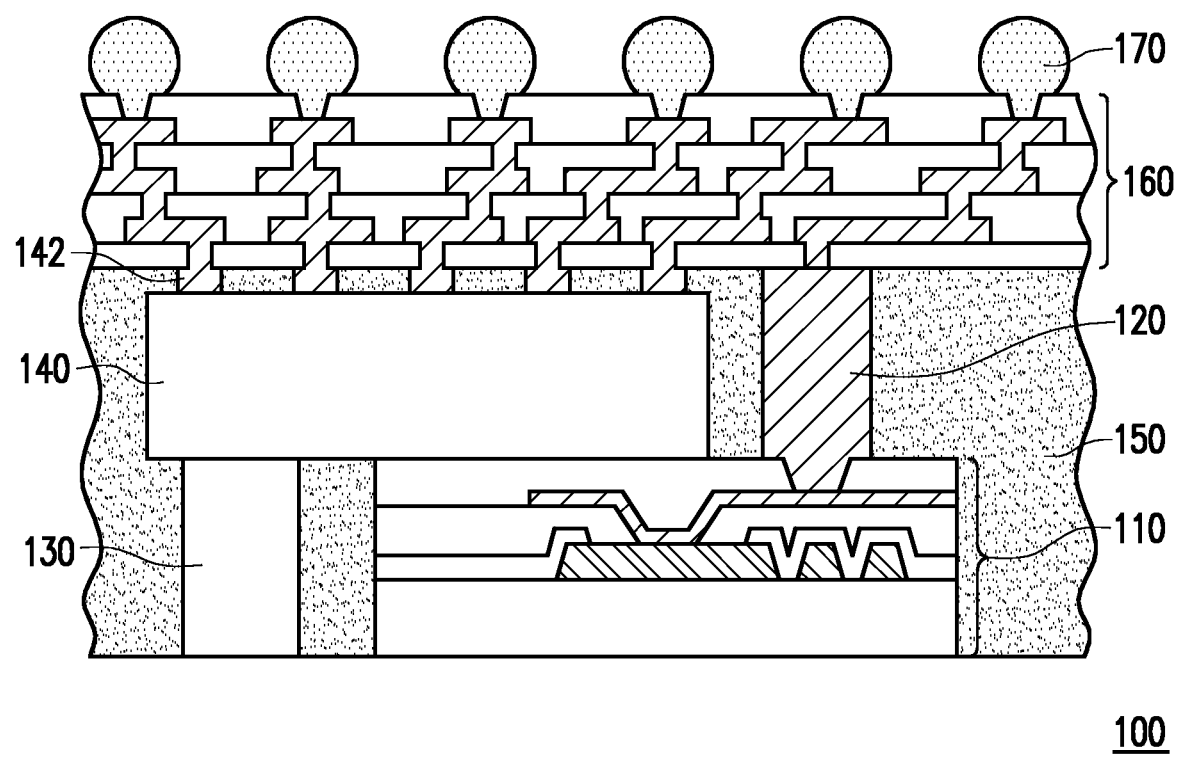

With reference now to FIG. 7, a redistribution structure 160 is formed over and electrically connected to the upper semiconductor device 140 and the conductive pillars 120. In some embodiments, the redistribution structure 160 is formed on the encapsulating material 150 and the upper semiconductor device 140. The redistribution structure 160 is electrically connected to the conductive pillars 120 and the electrical terminals 142 of the upper semiconductor device 140. Namely, the conductive pillars 120 are electrically connected to the electrical terminals 142 of the upper semiconductor device 140 through the redistribution structure 160. In some embodiments, a plurality of dielectric layers and a plurality of redistribution circuit layers may be stacked on top of one another alternately to form the redistribution structure 160 shown in FIG. 7. In some embodiments, the material of the dielectric layers of the redistribution structure 160 may include organic polymer such as, but not limited to, polyimide, etc. The material of the redistribution circuit layers may include copper, or any other suitable materials. In some embodiments, the redistribution circuit layer may be formed by a plating process. However, the disclosure does not limit the material and the manufacturing process of the dielectric layers and the redistribution circuit layers of the redistribution structure 160.

In accordance with some embodiments of the disclosure, a plurality of conductive bumps 170 may be disposed on the redistribution structure 160. In some embodiments, at least one integrated passive device (IPD) may also be mounted on the redistribution structure 160. The conductive bumps 170 and the integrated passive device (if any) are electrically connected to the redistribution structure 160. The formation of the conductive bumps 170 may include placing solder ball on the redistribution structure 160, and then reflowing the solder ball. In alternative embodiments, the formation of the conductive bumps 170 may include performing a plating process to form solder material on the redistribution structure 160, and then reflowing the solder material. The conductive bumps 170 may also include conductive pillars, or conductive pillars with solder caps, which may also be formed through plating. The integrated passive device 132 may be fabricated using standard wafer fabrication technologies such as thin film and photolithography processing, and may be mounted on the redistribution structure 160 through, for example, flip-chip bonding or wire bonding, etc.

Then, the carrier 101 shown in FIG. 6 may be removed. In some embodiments, the carrier 101 is detached from the encapsulated semiconductor device, by causing an adhesive thereon to lose or reduce adhesion. The adhesive is then removed along with the carrier 101. For example, the adhesive may be exposed to UV light, so that the adhesive loses or reduces adhesion, and hence the carrier 101 and the adhesive can be removed. At the time, a semiconductor package 100 may be substantially formed.

FIG. 10 to FIG. 16 illustrate schematic cross sectional views of various stages in a manufacturing process of a semiconductor package in accordance with some embodiments. It is noted that the semiconductor package with the arrangement illustrated in FIG. 8 or FIG. 9 may also be formed by other manufacturing process such as the process illustrate in FIG. 10 to FIG. 16. Accordingly, the manufacturing process of the semiconductor package 100' shown in FIG. 10 to FIG. 16 contains many features same as or similar to the manufacturing process of the semiconductor package 100 disclosed earlier with FIG. 1 to FIG. 9. For purpose of clarity and simplicity, detail description of same or similar features may be omitted, and the same or similar reference numbers denote the same or like components. The main differences between the manufacturing process of the semiconductor package 100' shown in FIG. 10 to FIG. 16 and the manufacturing process of the semiconductor package 100 shown in FIG. 1 to FIG. 9 are described as follows.

It is noted that the process shown in FIG. 10 to FIG. 16 can be applied to both the arrangements shown in FIG. 8 and FIG. 9. Therefore, the "lower semiconductor device 110" hereinafter may be referred to the first lower semiconductor device 110a and the second lower semiconductor device 110b shown in FIG. 8 and may also be referred to the lower semiconductor device 110 shown in FIG. 9. Similarly, the "conductive pillars 120" hereinafter may be referred to the first conductive pillars 120a and the second conductive pillars 120b shown in FIG. 8 and may also be referred to the conductive pillars 120 shown in FIG. 9.

Figure 10:
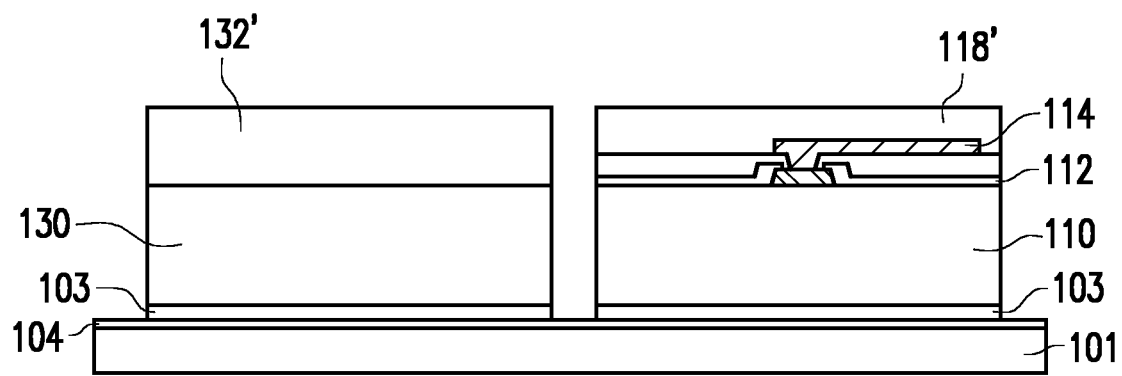
FIG. 10 to FIG. 16 illustrate schematic cross sectional views of various stages in a manufacturing process of a semiconductor package in accordance with some embodiments.

With reference now to FIG. 10, in accordance with some embodiments of the disclosure, the lower semiconductor device 110 and the dummy die 130 may first be disposed on the carrier 101 through, for example, a die attach film (DAF) 103 before the conductive pillars 120 are formed on the lower semiconductor device 110. In some embodiments, a passivation layer 118' of the lower semiconductor device 110 may firstly cover a top surface of the redistribution lines 114, and a passivation layer 132' may be optionally provided on a top surface of the dummy die 130. In some embodiments, the carrier 101 may be a glass carrier or any suitable carrier for the manufacturing process of the semiconductor package. In some embodiments, the carrier 101 may be coated with a de-bonding layer 104. The material of the de-bonding layer 104 may be any material suitable for de-bonding the carrier 101 from the above layers disposed thereon. For example, the de-bonding layer 104 may be a ultra-violet (UV) curable adhesive, a heat curable adhesive, an optical clear adhesive or a light-to-heat conversion (LTHC) adhesive, or the like, although other types of de-bonding layer may be used. In addition, the de-bonding layer 104 may be also adapted to allow light or signal to pass through. It is noted that the materials of the de-bonding layer 104 and the carrier 101 are merely for illustration, and the disclosure is not limited thereto.

Figure 11:
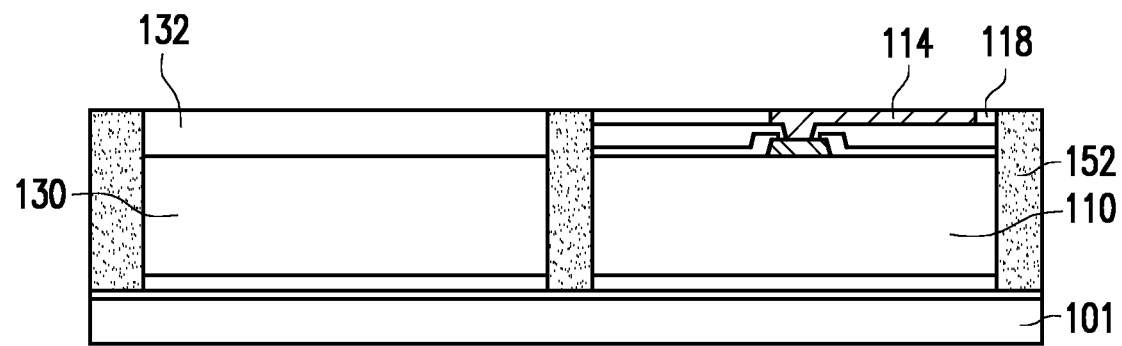

With reference now to FIG. 11, in some embodiments, the lower semiconductor device 110 and the dummy die 130 are encapsulated in a first encapsulating material 152. The first encapsulating material 152 may be a molding compound, a molding underfill, a resin, or the like in accordance with some embodiments. In some embodiments, the first encapsulating material 152 is dispensed as a fluid and then being compressed and cured, for example, in a thermal curing process. The first encapsulating material 152 fills the gaps between the lower semiconductor device 110 and the dummy die 130. After the encapsulating process, the top surface of the first encapsulating material 152 may cover the top surfaces of the lower semiconductor device 110 and the dummy die 130. Then, a thinning process such as a mechanical grinding, a CMP and/or a combination of both is performed to planarize the first encapsulating material 152 and reveal the redistribution lines 114 underneath as it is shown in FIG. 11. After the thinning process, top surfaces of the first encapsulating material 152, the passivation layer 118', the redistribution lines 114, and the dummy die 130 (or the passivation layer 132', if any) are substantially coplanar with one another.

Figure 12:
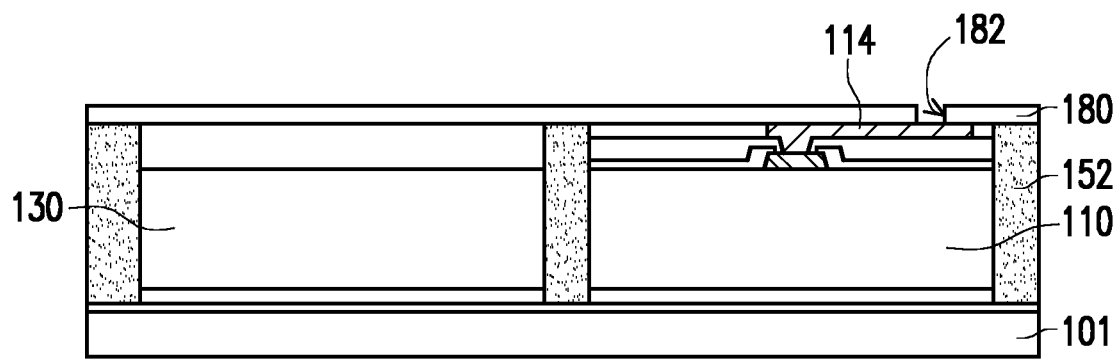

With reference now to FIG. 12, in some embodiments, a dielectric layer 180 is formed over the first encapsulating material 152, the lower semiconductor device 110 and the dummy die 130. In some embodiments, the dielectric layer 180 may be formed of a polymer such as PBO, polyimide, BCB, or the like. The dielectric layer 180 is then patterned to form a plurality of openings 182 exposing a part of the underlying redistribution lines 114.

Figure 13:
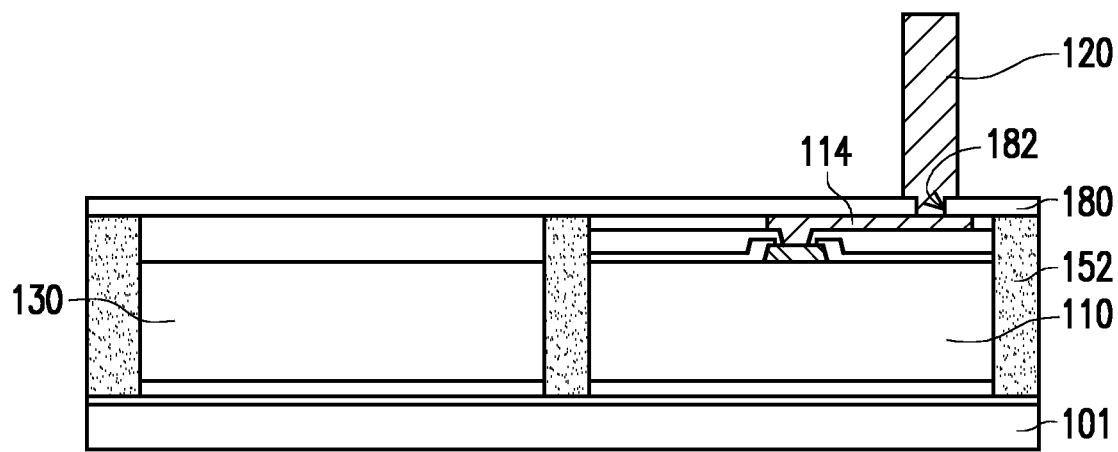

With reference now to FIG. 13, in some embodiments, the conductive pillars 120 are then formed in the openings 182 with similar process described above, such that the conductive pillars 120 extends through the dielectric layer 182 via the openings 182 to contact, and electrically coupling to, the redistribution lines 114.

Figure 14:
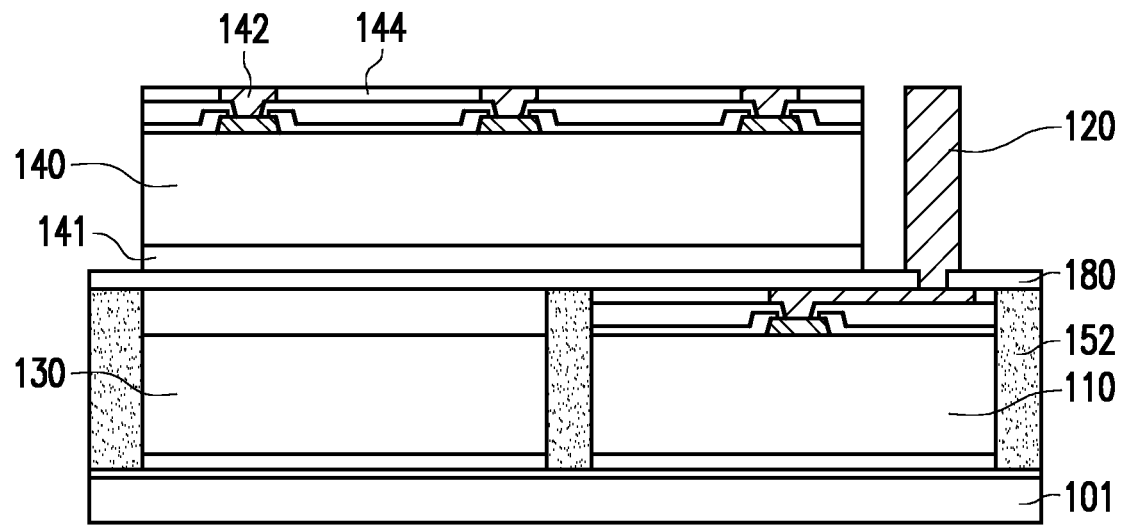

With reference now to FIG. 14, in some embodiments, the upper semiconductor device 110 are attached to the dielectric layer 180 through, for example, a DAF 141. Accordingly, the dielectric layer 180 is disposed between the lower semiconductor device 110 and the upper semiconductor device 110. In some embodiments, the upper semiconductor device 140 may include the electrical terminals 142 embedded in the respective passivation layer 144, which may be formed of a polymer such as PBO, polyimide, BCB, or the like.

Figure 15:
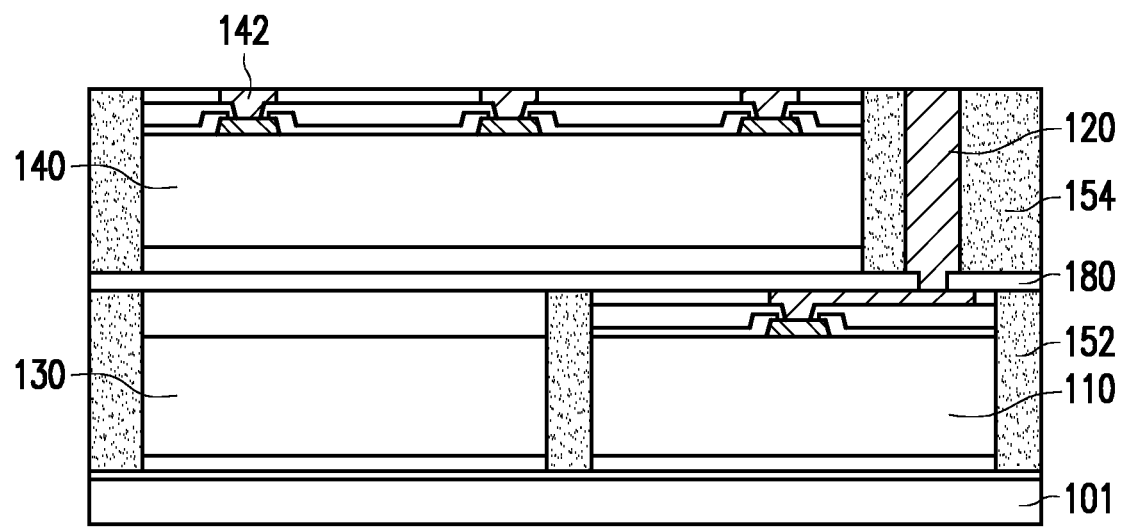
Figure 16:
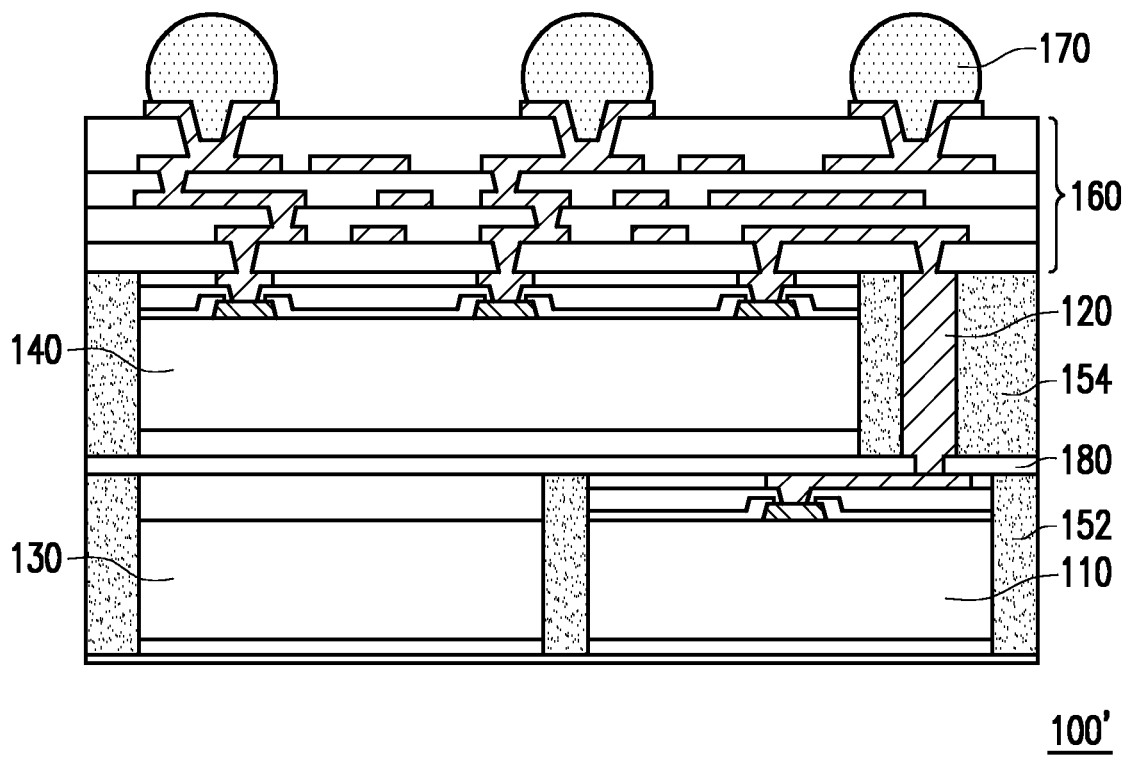

With reference now to FIG. 15, in some embodiments, the upper semiconductor device 140 and the conductive pillars 120 are encapsulated in a second encapsulating material 154. For example, the second encapsulating material 154 may be a molding compound, a molding underfill, a resin, or the like. Then, optionally, a thinning process such as a mechanical grinding, CMP or a combination of both is performed to planarize the second encapsulating material 154, the upper semiconductor device 140 and the conductive pillars 120, so that top surfaces of the electrical terminals 142 and the conductive pillars 120 are revealed. In the resulting structure, conductive pillars 120 penetrate through second encapsulating material 154.

With reference now to FIG. 15, in some embodiments, with similar process described above, the redistribution structure 160 is formed over and electrically connected to the upper semiconductor device 140 and the conductive pillars 120. In some embodiments, the redistribution structure 160 is formed on the second encapsulating material 154 and the upper semiconductor device 140. The redistribution structure 160 is electrically connected to the conductive pillars 120 and the electrical terminals 142 of the upper semiconductor device 140. Then, with similar process described above, the conductive bumps 170 may be disposed on a the redistribution structure 160. In some embodiments, at least one IPD may also be mounted on the redistribution structure 160. The conductive bumps 170 and the integrated passive device (if any) are electrically connected to the redistribution structure 160. Then, the carrier 101 shown in FIG. 15 may be removed. In some embodiments, the carrier 101 is detached from the encapsulated semiconductor device, by causing an adhesive thereon to lose or reduce adhesion. At the time, a semiconductor package 100' may be substantially formed.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes a first lower semiconductor device, a second lower semiconductor device, a plurality of first conductive pillars, a plurality of second conductive pillars, an upper semiconductor device, an encapsulating material, and a redistribution structure. The first lower semiconductor device and the second lower semiconductor device are disposed in a side by side manner. The plurality of first conductive pillars are disposed on the first lower semiconductor device along a first direction parallel to a side of the first lower semiconductor device. The plurality of second conductive pillars are disposed on the second lower semiconductor device along a second direction parallel to a side of the second lower semiconductor device, wherein the first direction is substantially collinear with the second direction. The upper semiconductor device is disposed on the first lower semiconductor device and the second lower semiconductor device and reveals a portion where the plurality of first conductive pillars and the plurality of second conductive pillars are disposed. The encapsulating material encapsulates the first lower semiconductor device, the second lower semiconductor device, the plurality of first conductive pillars, the plurality of second conductive pillars, and the upper semiconductor device. The redistribution structure is disposed over and electrically connected to the upper semiconductor device, the plurality of first conductive pillars and the plurality of second conductive pillars.

In accordance with some embodiments of the disclosure, a semiconductor package includes a lower semiconductor device, a plurality of conductive pillars, an upper semiconductor device, an encapsulating material, and a redistribution structure. The plurality of conductive pillars are disposed on the lower semiconductor device along a direction parallel to a side of the lower semiconductor device, wherein a gap between adjacent two of the plurality of the conductive pillars is substantially greater than a gap between any other adjacent two of the plurality of the conductive pillars. The upper semiconductor device is disposed on the lower semiconductor device and reveals a portion of the lower semiconductor device where the plurality of conductive pillars are disposed. The encapsulating material encapsulates the lower semiconductor device, the plurality of conductive pillars, and the upper semiconductor device. The redistribution structure is disposed over and electrically connected to the upper semiconductor device and the plurality of conductive pillars.

In accordance with some embodiments of the disclosure, a manufacturing method of a semiconductor package includes the following steps. At least one lower semiconductor device is provided. A plurality of conductive pillars are formed on the at least one lower semiconductor device. A dummy die is disposed on a side of the at least one lower semiconductor device. An upper semiconductor device is disposed on the at least one lower semiconductor device and the dummy die, wherein the upper semiconductor device reveals a portion of the at least one lower semiconductor device where the plurality of conductive pillars are disposed. The at least one lower semiconductor device, the dummy die, the upper semiconductor device, and the plurality of conductive pillars are encapsulated in an encapsulating material. A redistribution structure is formed over the upper semiconductor device and the plurality of conductive pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a lower semiconductor device;
    a plurality of conductive pillars disposed on the lower semiconductor device along a direction parallel to a side of the lower semiconductor device, wherein the lower semiconductor device comprises a plurality of electrical terminals disposed along the side of the lower semiconductor device and electrically connected to the plurality of conductive pillars respectively;
    an upper semiconductor device disposed on the lower semiconductor device and revealing a portion of the lower semiconductor device where the plurality of conductive pillars are disposed, wherein the plurality of conductive pillars disposed by the same side of the upper semiconductor device and the upper semiconductor device comprises a cantilever part cantilevered over the lower semiconductor device;
    an encapsulating material encapsulating the lower semiconductor device, the plurality of conductive pillars, and the upper semiconductor device; and
    a redistribution structure disposed over the upper semiconductor device and the encapsulating material.

2. The semiconductor package as claimed in claim 1, further comprising a dummy die disposed with the lower semiconductor device in a side-by-side manner, wherein the upper semiconductor device is disposed on the dummy die and the lower semiconductor device.

3. The semiconductor package as claimed in claim 2, wherein at least a part of the cantilever part of the upper semiconductor device leans on the dummy die.

4. The semiconductor package as claimed in claim 2, wherein an upper surface of the dummy die is substantially coplanar with an upper surface of the lower semiconductor device.

5. The semiconductor package as claimed in claim 1, the lower semiconductor device comprises a plurality of electrical terminals disposed along two opposite sides connected to the side of the lower semiconductor device and electrically connected to the plurality of conductive pillars respectively.

6. The semiconductor package as claimed in claim 1, further comprising:
    a dielectric layer disposed on the lower semiconductor device, the upper semiconductor device disposed on the dielectric layer, and the plurality of conductive pillars extending through the dielectric layer.

7. The semiconductor package as claimed in claim 1, wherein a gap between adjacent two of the plurality of the conductive pillars is substantially greater than a gap between other adjacent two of the plurality of the conductive pillars, and the adjacent two of the plurality of the conductive pillars are right next to each other.

8. The manufacturing method of the semiconductor package as claimed in claim 7, wherein the adjacent two of the plurality of the conductive pillars are arranged collinearly with the other adjacent two of the plurality of the conductive pillars.

9. A semiconductor package, comprising:
    a lower semiconductor device;
    a plurality of first conductive pillars disposed on the lower semiconductor device along a direction parallel to a side of the lower semiconductor device;
    a plurality of second conductive pillars disposed on the lower semiconductor device along the direction, wherein a gap between one of the first conductive pillars closest to the second conductive pillars and one of the second conductive pillars closest to the one of the first conductive pillars is substantially longer than a gap between other adjacent two of the first conductive pillars or the second conductive pillars;
    an upper semiconductor device disposed on the lower semiconductor device and revealing a portion of the lower semiconductor device where the plurality of first conductive pillars and the plurality of second conductive pillars are disposed;
    a dummy die disposed with the lower semiconductor device in a side-by-side manner, wherein the upper semiconductor device is disposed on the dummy die and the lower semiconductor device, wherein the dummy die is electrically insulated from the plurality of conductive pillars, and at least a part of the cantilever part of the upper semiconductor device leans on the dummy die; and
    an encapsulating material encapsulating the lower semiconductor device, the plurality of first conductive pillars, the plurality of second conductive pillars, and the upper semiconductor device.

10. The semiconductor package as claimed in claim 9, wherein the plurality of first conductive pillars and the plurality of second conductive pillars are located on a same side of the upper semiconductor device from a top view.

11. The semiconductor package as claimed in claim 9, further comprising:
    a redistribution structure disposed over the encapsulating material and electrically connected to the upper semiconductor device, the plurality of first conductive pillars, and the plurality of second conductive pillars.

12. The semiconductor package as claimed in claim 9, wherein an upper surface of the dummy die is substantially coplanar with an upper surface of the lower semiconductor device.

13. The semiconductor package as claimed in claim 9, the lower semiconductor device comprises a plurality of electrical terminals disposed along the side of the lower semiconductor device and electrically connected to the plurality of first conductive pillars and the plurality of second conductive pillars respectively.

14. The semiconductor package as claimed in claim 9, wherein the lower semiconductor device comprises a plurality of electrical terminals disposed along two opposite sides connected to the side of the lower semiconductor device and electrically connected to the plurality of first conductive pillars and the plurality of second conductive pillars respectively.

15. The semiconductor package as claimed in claim 9, wherein the gap between the one of the first conductive pillars and the one of the second conductive pillars right next to the one of the first conductive pillars is substantially longer than the gap between the other adjacent two of the first conductive pillars or the second conductive pillars.

16. The semiconductor package as claimed in claim 9, wherein the plurality of first conductive pillars and the plurality of second conductive pillars are arranged along a first side of upper semiconductor device, and the dummy die and the lower semiconductor device are disposed side-by-side along a second side of upper semiconductor device not parallel to the first side.

17. A manufacturing method of a semiconductor package, comprising:
providing a lower semiconductor device;
forming a plurality of conductive pillars on the lower semiconductor device;
disposing a dummy die at a side of the lower semiconductor device;
disposing an upper semiconductor device on the lower semiconductor device and the dummy die, wherein the upper semiconductor device reveals a portion of the at least one lower semiconductor device where the plurality of conductive pillars are disposed, a cantilever part of the upper semiconductor device is cantilevered over the lower semiconductor device, and leans on the dummy die;
encapsulating the lower semiconductor device, the dummy die, the upper semiconductor device, and the plurality of conductive pillars by an encapsulating material; and
forming a redistribution structure over the upper semiconductor device and the plurality of conductive pillars.

18. The manufacturing method of the semiconductor package as claimed in claim 17, wherein the dummy die is disposed on the lower semiconductor device before the plurality of conductive pillars are formed on the at least one lower semiconductor device.

19. The manufacturing method of the semiconductor package as claimed in claim 17, wherein encapsulating the lower semiconductor device, the dummy die, the upper semiconductor device, and the plurality of conductive pillars by the encapsulating material further comprises:
encapsulating the lower semiconductor device and the dummy die by a first encapsulating material before the plurality of conductive pillars are formed;
forming a dielectric layer over the first encapsulating material, the lower semiconductor device and the dummy die before the plurality of conductive pillars are formed, wherein the plurality of conductive pillars extend through the dielectric layer; and
encapsulating the upper semiconductor device and the plurality of conductive pillars by a second encapsulating material.

20. The manufacturing method of the semiconductor package as claimed in claim 19, wherein the upper semiconductor device is disposed over the dielectric layer.

* * * * *